(12) United States Patent
Kim et al.

(10) Patent No.: US 7,688,651 B2
(45) Date of Patent: Mar. 30, 2010

(54) METHODS AND DEVICES FOR REGULATING THE TIMING OF CONTROL SIGNALS IN INTEGRATED CIRCUIT MEMORY DEVICES

(75) Inventors: Chi-wook Kim, Gyeonggi-do (KR);
Tai-young Ko, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 413 days.

(21) Appl. No.: 11/756,750

(22) Filed: Jun. 1, 2007

(65) Prior Publication Data
US 2007/0280033 A1 Dec. 6, 2007

(30) Foreign Application Priority Data
Jun. 1, 2006 (KR) ...................... 10-2006-0049294

(51) Int. Cl.
*G11C 7/00* (2006.01)
(52) U.S. Cl. ................ 365/191; 365/189.07; 365/233.1
(58) Field of Classification Search ................. 365/191, 365/233.1, 189.07
See application file for complete search history.

(56) References Cited

U.S. PATENT DOCUMENTS 6,252,820 B1   6/2001   Nakamura 6,538,933 B2 * 3/2003 Akioka et al. ............... 365/194
7,177,214 B2 * 2/2007 Lee ............................ 365/203

FOREIGN PATENT DOCUMENTS

| JP | 11-025699 | 1/1999 |
|---|---|---|
| JP | 2001-101868 | 4/2001 |
| WO | WO 03/105157 A1 | 12/2003 |

* cited by examiner

*Primary Examiner*—Hoai V Ho
*Assistant Examiner*—Kretelia Graham
(74) *Attorney, Agent, or Firm*—Myers Bigel Sibley & Sajovec, P.A.

(57) ABSTRACT

A method of regulating timing of control signals in an integrated circuit memory device includes generating a pulse signal having a pulse width representing a time period between a rising edge of a first control signal and a rising edge of a second control signal that is activated after the first control signal. Based on the pulse width of the pulse signal, it is determined whether a timing margin between activation of the first control signal and activation of the second control signal is within a predetermined range, and the timing margin is adjusted responsive to the determination. For example, the pulse signal may be a timing measurement signal including a first pulse signal representing a first timing margin between a word line enable signal and a bit line sensing enable signal, a second pulse signal representing a second timing margin between a column select line enable signal and a first read pulse signal, and a third pulse signal representing a third timing margin between a word line disable signal and a bit line equalizing signal. Related devices are also discussed.

26 Claims, 5 Drawing Sheets

METHODS AND DEVICES FOR REGULATING THE TIMING OF CONTROL SIGNALS IN INTEGRATED CIRCUIT MEMORY DEVICES

CROSS-REFERENCE TO RELATED PATENT APPLICATIONS

This application claims priority from Korean Patent Application No. 10-2006-0049294, filed on Jun. 1, 2006, in the Korean Intellectual Property Office, the disclosure of which is incorporated by reference herein in its entirety.

FIELD OF THE INVENTION

The present invention relates to integrated circuit memory devices, and more particularly, to regulation of the timing of control signals in integrated circuit memory devices.

BACKGROUND OF THE INVENTION

The operation of an integrated circuit memory device may be controlled by various control signals. For example, in a data read operation of an integrated circuit memory device, memory cells belonging to a specific row may be selected according to a word line enable signal from a plurality of memory cells arranged in a matrix form, data transmitted from a memory cell belonging to a specific column among the memory cells of the specific row may be selected according to a column select line enable signal, and data read from the memory cells may be output in synchronization with a first read pulse signal output from an input/output sense amplifier after a predetermined time has elapsed from when the column select line enable signal is enabled.

In order to stabilize the operation of an integrated circuit memory device, it may be advantageous to maintain predetermined timing gaps between control signals. That is, control signals involved in a specific operation of the integrated circuit memory device may be enabled to provide a time lag between signals corresponding to one or more predetermined timing gaps. When a predetermined timing gap is not maintained between the control signals, that is, when timing characteristics are poor, stable operation of the integrated circuit memory device may not be guaranteed. The timing characteristics may be sensitive to the operating environment of the integrated circuit memory device, and thus variations in the operating environment of the integrated circuit memory device may contribute to errors in data read operations and/or data write operations.

As the operating speed of the integrated circuit memory device is increased, the timing characteristics may increasingly affect the performance of the integrated circuit memory device. Thus, the timing characteristics may significantly influence the performance of the integrated circuit memory device when the operating speed of the integrated circuit memory device is increased.

Accordingly, it may be desirable to reduce and/or prevent performance degradation of the integrated circuit memory device that may be caused by instability of the timing characteristics. In order to achieve this, the current timing gap between control signals may be correctly measured, and the timing gap between the control signals may be controlled based on the measurement result. As such, various methods for controlling timing gaps between control signals have been proposed. One such method is described in U.S. Pat. No. 6,252,820, entitled "Semiconductor memory device capable of monitoring and adjusting the timing and pulse width of internal control signals".

SUMMARY OF THE INVENTION

Some embodiments of the present invention may provide a timing measurement signal generator that may allow the measurement of a timing gap between control signals to more precisely control the operation of a semiconductor memory device.

Other embodiments of the present invention may provide a timing regulating device and method for regulating the timing of control signals used in a semiconductor memory device on the based on a timing measurement signal.

According to some embodiments of the present invention, a timing measurement signal generator may be configured to generate a signal representing a timing gap between control signals for controlling the operation of a semiconductor memory device. The timing measurement signal generator may include a first pulse generator, a second pulse generator, a third pulse generator, and a pulse summing unit. The first pulse generator may be configured to generate a first pulse signal corresponding to a timing gap between a word line enable signal and a bit line sensing enable signal. The second pulse generator may be configured to generate a second pulse signal corresponding to a timing gap between a column select line enable signal and a first read pulse signal output from an input/output sense amplifier. The third pulse generator may be configured to generate a third pulse signal corresponding to a timing gap between a word line disable signal and a bit line equalizing signal. The pulse summing unit may be configured to sum the first, second and third pulse signals to generate a timing measurement signal.

In some embodiments, the first pulse generator may be configured to receive the word line enable signal and the bit line sensing enable signal from a row decoder.

In other embodiments, the second pulse generator may be configured to receive the column line select enable signal from a column decoder and may be configured to receive the first read pulse signal from the input/output sense amplifier.

In some embodiments, the third pulse generator may be configured to receive the word line disable signal and the bit line equalizing signal from a row decoder.

In other embodiments, the pulse summing unit may be configured to perform a logic OR operation on the first, second and third pulse signals and output the operation result as the timing measurement signal.

According to further embodiments of the present invention, a timing regulating device for regulating a timing gap between control signals for controlling the operation of a semiconductor memory device may include a timing measurement signal generator, a timing judgement unit and a timing setting unit. The timing measurement signal generator may be configured to sum up a first pulse signal corresponding to a timing gap between a word line enable signal and a bit line sensing enable signal, a second pulse signal corresponding to a timing gap between a column select line enable signal and a first read pulse signal output from an input/output sense amplifier, and a third pulse signal corresponding to a timing gap between a word line disable signal and a bit line equalizing signal to generate a timing measurement signal. The timing judgement unit may be configured to judge whether the current timing parameter measured from the timing measurement signal belongs to a predetermined standard range, and may be configured to output a timing set signal corresponding to the judgement result. The timing setting unit may be configured to set the timing of the word line enable signal, the bit line sensing enable signal, the column select line enable signal, the first read pulse signal, the word line disable signal and the bit line equalizing signal in response to the timing set signal.

In some embodiments, the current timing parameter may represent information about a bit line charge sharing margin measured from the pulse width of the first pulse signal, information about a column select line enable to first read pulse margin measured from the pulse width of the second pulse signal, and information about a word line disable to bit line equalizing margin measured from the pulse width of the third pulse signal.

According to still other embodiments of the present invention, a method for regulating a timing gap between control signals for controlling the operation of a semiconductor memory device may include generating a first pulse signal corresponding to a timing gap between a word line enable signal and a bit line sensing enable signal; generating a second pulse signal corresponding to a timing gap between a column select line enable signal and a first read pulse signal output from an input/output sense amplifier; generating a third pulse signal corresponding to a timing gap between a word line disable signal and a bit line equalizing signal; performing a logic OR operation on the first, second and third pulse signals to generate a timing measurement signal; judging whether the current timing parameter measured from the timing measurement signal belongs to a predetermined standard range; and setting timings of the word line enable signal, the bit line sensing enable signal, the column select line enable signal, the first read pulse signal, the word line disable signal and the bit line equalizing signal in response to the judgement result.

According to further embodiments of the present invention, a method of regulating timing of control signals in an integrated circuit memory device may include generating a pulse signal having a pulse width representing a time period between a rising edge of a first control signal and a rising edge of a second control signal that is activated after the first signal. Based on the pulse width of the pulse signal, it may be determined whether a timing margin between activation of the first control signal and activation of the second control signal is within a predetermined range. The timing margin between activation of the first control signal and activation of the second control signal may be adjusted responsive to the determination.

In some embodiments, the first control signal may be a word line enable signal configured to select memory cells of a row of a memory cell array, and the second control signal may be a bit line sensing enable signal configured to amplify data read from a memory cell of the selected row.

In other embodiments, the first control signal may be a column select line enable signal configured to select memory cells of a column of a memory cell array, and the second control signal may be a first read pulse signal configured to synchronize data output from a memory cell of the selected column.

In still other embodiments, the first control signal may be a word line disable signal configured to disable memory cells of a row of the memory cell array, and the second control signal may be a bit line equalizing signal configured to equalize a bit line of the memory cell array after data is output therefrom.

In some embodiments, the pulse signal may be generated by performing a logical inversion operation on the second signal, and performing a logic AND operation on the first signal and the inverted second signal to generate the pulse signal.

According to still further embodiments of the present invention, a method of regulating timing of control signals in an integrated circuit memory device may include generating a timing measurement signal including a first pulse width representing a first timing margin between a word line enable signal and a bit line sensing enable signal, a second pulse width representing a second timing margin between a column select line enable signal and a first read pulse signal, and a third pulse width representing a third timing margin between a word line disable signal and a bit line equalizing signal.

In some embodiments, it may be determined whether the first, second, and/or third timing margins are within a predetermined range based on the first, second, and/or third pulse widths of the timing measurement signal. As such, the first, second, and/or third timing margins may be altered based on the determination. For example, a timing set signal indicating that at least one of the first, second, and/or third timing margins are not within the predetermined range may be generated responsive to the determination, and relative activation times of the word line enable signal and the bit line sensing enable signal, the column select line enable signal and the first read pulse signal, and/or the word line disable signal and the bit line equalizing signal may be adjusted based on the timing set signal.

In other embodiments, a first pulse signal may be generated having the first pulse width representing a time period between a rising edge of the word line enable signal and a rising edge of the bit line sensing enable signal. Also, a second pulse signal may be generated having the second pulse width representing a time period between a rising edge of the column select line enable signal and a rising edge of the first read pulse signal, and a third pulse signal may be generated having the third pulse width representing a time period between a rising edge of the word line disable signal and a rising edge of the bit line equalizing signal. The first, second, and third pulse signals may be combined to generate the timing measurement signal. For example, the first, second, and third pulse signals may be combined by performing a logic OR operation on the first, second, and third pulse signals to generate the timing measurement signal.

In some embodiments, the first, second, and third pulse signals of the timing measurement signal may be synchronized with a reference clock signal of the integrated circuit memory device.

According to other embodiments of the present invention, a device for regulating timing of control signals in an integrated circuit memory device may include a timing measurement signal generator. The timing measurement signal generator may be configured to generate a timing measurement signal including a first pulse width representing a first timing margin between a word line enable signal and a bit line sensing enable signal, a second pulse width representing a second timing margin between a column select line enable signal and a first read pulse signal, and a third pulse width representing a third timing margin between a word line disable signal and a bit line equalizing signal.

In some embodiments, the device may further include a timing judgment unit and a timing setting unit. The timing judgment unit may be configured to determine whether the first, second, and/or third timing margins are within a predetermined range based on the first, second, and/or third pulse widths of the timing measurement signal. The timing setting unit may be configured to alter the first, second, and/or third timing margins responsive to the determination of the timing judgment unit.

In other embodiments, the timing measurement signal generator may be configured to output the timing measurement signal to an output pad of the integrated circuit memory device via an output buffer.

In some embodiments, the timing measurement signal generator may include first, second, and third pulse generators. The first pulse generator may be configured to generate a first pulse signal having the first pulse width representing a time period between a rising edge of the word line enable signal and a rising edge of the bit line sensing enable signal. The second pulse generator may be configured to generate a second pulse signal having the second pulse width representing a time period between a rising edge of the column select line enable signal and a rising edge of the first read pulse signal. The third pulse generator may be configured to generate a third pulse signal having the third pulse width representing a time period between a rising edge of the word line disable signal and a rising edge of the bit line equalizing signal. The device may further include a pulse summing unit configured to combine the first, second, and third pulse signals to generate the timing measurement signal.

DETAILED DESCRIPTION OF EMBODIMENTS OF THE INVENTION

Figure 1:
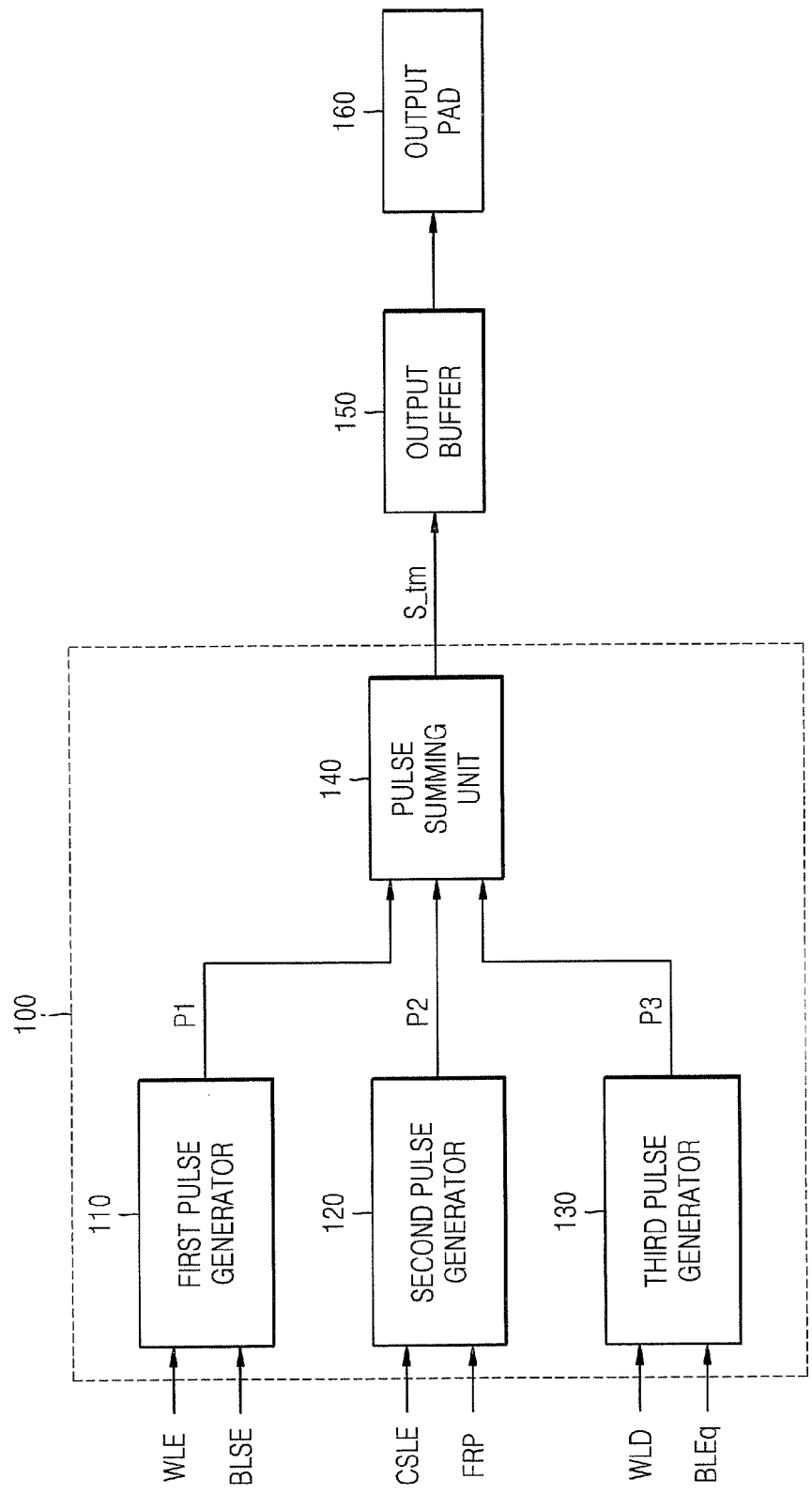
FIG. 1 is a block diagram of a timing measurement signal generator according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification, and will not be interpreted in an idealized or overly formal sense unless expressly so defined herein.

FIG. 1 is a block diagram of a timing measurement signal generator 100 according to some embodiments of the present invention. The timing measurement signal generator 100 includes a first pulse generator 110, a second pulse generator 120, a third pulse generator 130 and a pulse summing unit 140. A timing measurement signal S_tm output from the pulse summing unit 140 can be output to an external device through an output buffer 150 and an output pad 160.

The timing measurement signal generator 100 receives a word line enable signal WLE, a bit line sensing enable signal BLSE, a column select line enable signal CSLE, a first read pulse signal FRP output from an input/output sense amplifier, a word line disable signal WLD, and a bit line equalizing signal BLEq. The word line enable signal WLE, the bit line sensing enable signal BLSE, the column select line enable signal CSLE, the first read pulse signal FRP, the word line disable signal WLD, and the bit line equalizing signal BLEq are representative control signals for controlling the operation of an integrated circuit memory device. Embodiments of the present invention may be configured to simultaneously measure a timing gap between the word line enable signal WLE and the bit line sensing enable signal BLSE, a timing gap between the column select line enable signal CSLE and the first read pulse signal FRP, and a timing gap between the word line disable signal WLD and the bit line equalizing signal BLEq.

The first pulse generator 110 generates a first pulse signal P1 corresponding to the timing gap between the word line enable signal WLE and the bit line sensing enable signal BLSE. Here, the word line enable signal WLE controls an operation of selecting memory cells belonging to a specific row from a plurality of memory cells arranged in a matrix formation. The bit line sensing enable signal BLSE controls an operation of a bit line sense amplifier to amplify data read from the memory cells belonging to the specific row.

The first pulse signal P1 generated by the first pulse generator 110 includes information about the timing gap between the word line enable signal WLE and the bit line sensing enable signal BLSE, that is, information about how much time exists from when the word line enable signal WLE is enabled to when the bit line sensing enable signal BLSE is enabled.

The second pulse generator 120 generates a second pulse signal P2 corresponding to the timing gap between the column select line enable signal CSLE and the first read pulse signal FRP. Here, the column select line enable signal CSLE controls an operation of loading only data transmitted from a memory cell belonging to a specific column among the memory cells belonging to the specific row to a data bus line. The first read pulse signal FRP is output from the input/output sense amplifier. Data read from memory cells starts to be output in synchronization with the first read pulse signal FRP.

The second pulse signal P2 generated by the second pulse generator 120 includes information about the timing gap between the column select line enable signal CSLE and the first read pulse signal FRP, that is, information about how much time exists from when the column select line enable signal CSLE is enabled to when the first read pulse signal FRP is enabled.

The third pulse generator 130 generates a third pulse signal P3 corresponding to the timing gap between the word line disable signal WLD and the bit line equalizing signal BLEq. Here, the word line disable signal WLD disables a word line enabled by the word line enable signal WLE. When the word line is disabled by the word line disable signal WLD, a data route between memory cells and a bit line is blocked. The bit line equalizing signal BLEq controls an operation of equalizing the bit line and a complementary bit line after data transmitted from a memory cell to the bit line and the complementary bit line is read.

The third pulse signal P3 generated by the third pulse generator 123 includes information about the timing gap between the word line disable signal WLD and the bit line equalizing signal BLEq, that is, information about how much time exists from when the word line disable signal WLD is enabled to when the bit line equalizing signal BLEq is enabled.

The pulse summing unit 140 sums up the first pulse signal P1, the second pulse signal P2 and the third pulse signal P3 in order to generate the timing measurement signal S_tm. The timing measurement signal S_tm includes the information about the timing gap between the word line enable signal WLE and the bit line sensing enable signal BLSE, the information about the timing gap between the column select line enable signal CSLE and the first read pulse signal FPR and the information about the timing gap between the word line disable signal WLD and the bit line equalizing signal BLEq.

As illustrated in FIG. 1, the timing measurement signal S_tm output from the pulse summing unit 140 can be output to an external device through the output buffer 150 and the output pad 160. To output the timing measurement signal S_tm, it may be advantageous to use the output buffer 150 included in the integrated circuit memory device instead of adding a separate component. The output buffer 150 buffers a data signal output from the input/output sense amplifier and transmits the data signal to the output pad 160 (refer to FIG. 2).

Figure 2:
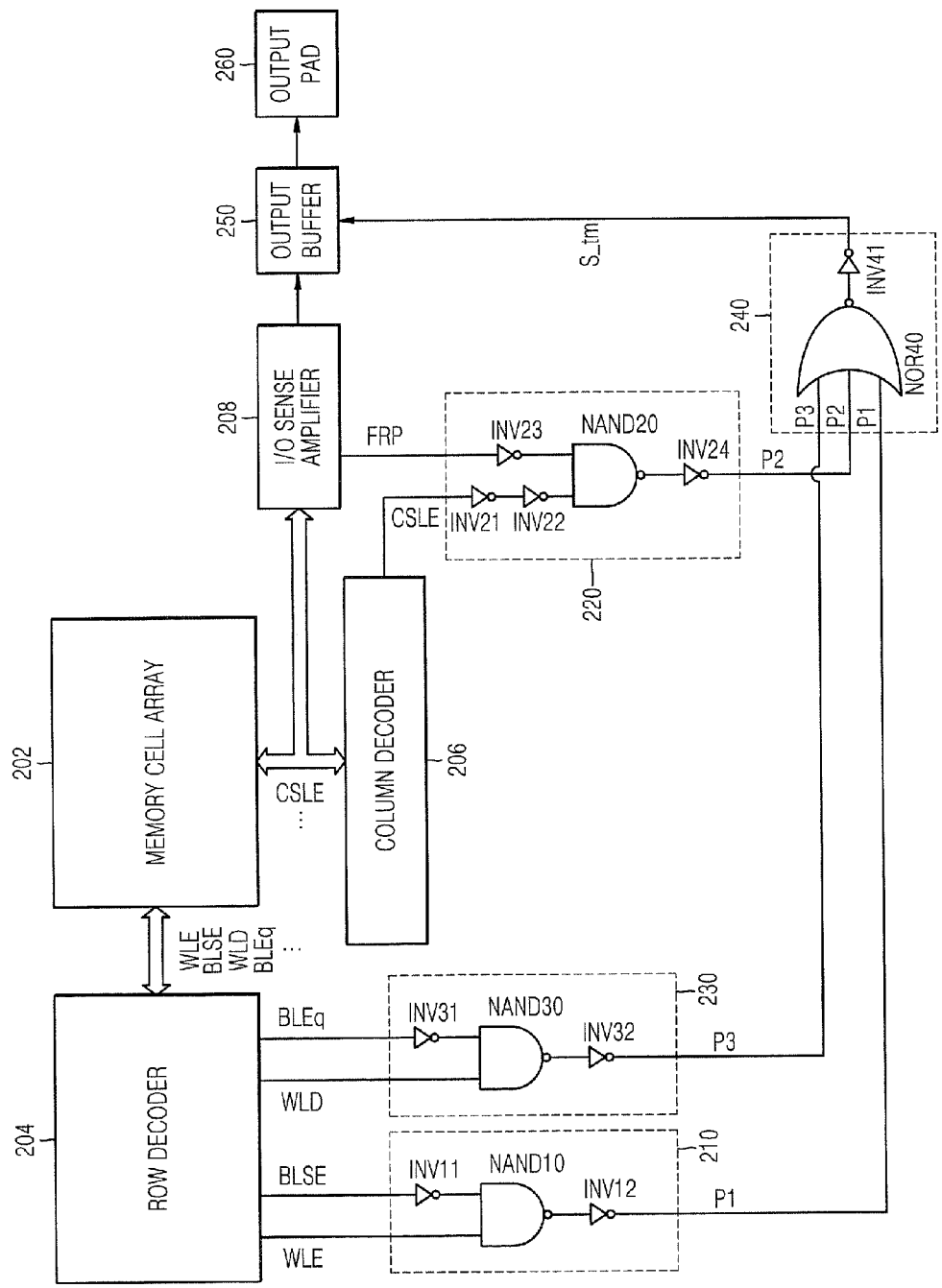
FIG. 2 illustrates a configuration of timing measurement signal generators according to some embodiments of the present invention.

FIG. 2 illustrates a configuration of the timing measurement signal generator according to some embodiments of the present invention. A memory cell array 202, a row decoder 204, a column decoder 206, an input/output sense amplifier 208, a first pulse generator 210, a second pulse generator 220, a third pulse generator 230, a pulse summing unit 240, an output buffer 250 and an output pad 260 are illustrated in FIG. 2. Among these components, the first pulse generator 210, the second pulse generator 220, the third pulse generator 230 and the pulse summing unit 240 are constituent elements of the timing measurement signal generator according to an embodiment of the present invention.

The memory cell array 202 includes a plurality of memory cells arranged in a matrix formation. Memory cells belonging to a specific row are selected from the plurality of memory cells according to the word line enable signal WLE output from the row decoder 204. Data transmitted from a memory cell belonging to a specific column among the memory cells belonging to the specific row is selected according to the column select line enable signal CSLE output from the column decoder 206. The data of the specific memory cell, selected by the word line enable signal WLE and the column select line enable signal CSLE, is input to the input/output sense amplifier 208 through a predetermined data route. The data of the specific memory cell is amplified by the input/output sense amplifier 208 and then output to an external device through the output buffer 250 and the output pad 260.

The first pulse generator 210 receives the word line enable signal WLE and the bit line sensing enable signal BLSE from the row decoder 204. In order to generate the first pulse signal P1 corresponding to the timing gap between the word line enable signal WLE and the bit line sensing enable signal BLSE, the first pulse generator 210 includes a first inverter INV11 inverting the bit line sensing enable signal BLSE, a NAND gate NAND10 performing a logic NAND operation on the word line enable signal WLE and the output signal of the first inverter INV11, and a second inverter INV12 inverting the output signal of the NAND gate NAND10 and outputting the inverted signal as the first pulse signal P1.

The second pulse generator 220 receives the column select line enable signal CSLE from the column decoder 206 and receives the first read pulse signal FRP from the input/output sense amplifier 208. In order to generate the second pulse signal P2 corresponding to the timing gap between the column select line enable signal CSLE and the first read pulse signal FRP, the second pulse generator 220 includes a first inverter INV21 inverting the column select line enable signal CSLE, a second inverter INV22 inverting the output signal of the first inverter INV21, a third inverter INV23 inverting the first read pulse signal FRP, a NAND gate NAND20 performing a logic NAND operation on the output signal of the second inverter INV22 and the output signal of the third inverter INV23, and a fourth inverter INV24 inverting the output signal of the NAND gate NAND20 and outputting the inverted signal as the second pulse signal P2.

The third pulse generator 230 receives the word line disable signal WLD and the bit line equalizing signal BLEq from the row decoder 204. In order to generate the third pulse signal P3 corresponding to the timing gap between the word line disable signal WLD and the bit line equalizing signal BLEq, the third pulse generator 230 includes a first inverter INV31 inverting the bit line equalizing signal BLEq, a NAND gate NAND30 performing a logic NAND operation on the word line disable signal WLD and the output signal of the first inverter INV31, and a second inverter INV32 inverting the output signal of the NAND gate NAND30 and outputting the inverted signal as the third pulse signal P3.

While specific elements of the first, second and third pulse generators 210, 220 and 230 specifically illustrated in FIG. 2 to generate timing measurement signals according to some embodiments of the present invention, the present invention is not limited to this configuration. For example, any combination of components capable of generating a pulse signal corresponding to a timing gap between two signals may be used in the first pulse generator 210, the second pulse generator 220, and/or the third pulse generator 230.

Still referring to FIG. 2, the pulse summing unit 240 performs a logic OR operation on the first pulse signal P1, the second pulse signal P2 and the third pulse signal P3 and outputs the resultant signal as the timing measurement signal S_tm. To perform a logic OR operation on the first pulse signal P1, the second pulse signal P2 and the third pulse signal P3, the pulse summing unit 240 includes a NOR gate NOR40 carrying out a logic NOR operation on the first, second and third pulse signals P1, P2 and P3 and an inverter INV41 inverting the output signal of the NOR gate NOR40 and outputting the inverted signal as the timing measurement signal S_tm. However, in some embodiments, the pulse summing unit 240 can be configured to include an OR gate.

Figure 3A:
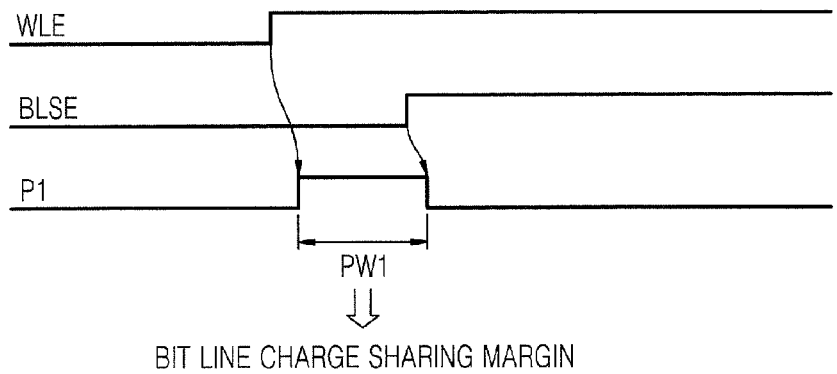
FIGS. 3A, 3B and 3C are timing diagrams of input signals and output signals of first, second and third pulse generators, respectively, included in timing measurement signal generators according to some embodiments of the present invention.
Figure 3B:
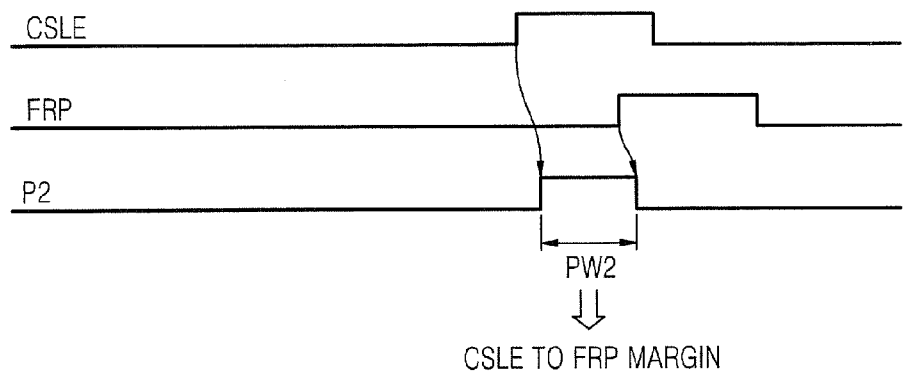
Figure 3C:
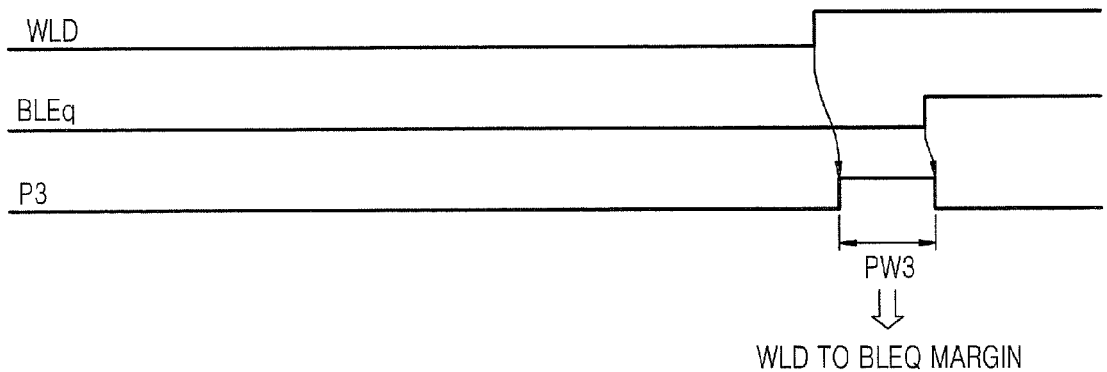

FIGS. 3A, 3B and 3C are timing diagrams of input signals and output signals of the first, second and third pulse generators, respectively, included in the timing measurement signal generator according to some embodiments of the present invention.

FIG. 3A is a timing diagram of the input signals and the output signal of the first pulse generator 110 and 210 illustrated in FIGS. 1 and 2, respectively. The first pulse generator 110 and/or 210 receives the word line enable signal WLE and the bit line sensing enable signal BLSE and generates the first pulse signal P1. Referring to FIG. 3A, the pulse width PW1 of the first pulse signal P1 corresponds to the timing gap between activation of the word line enable signal WLE and activation of the bit line sensing enable signal BLSE. In other words, the pulse width PW1 represents a time period between a rising edge of the word line enable signal WLE and a rising edge of the bit line sensing enable signal BLSE. Thus, the pulse width PW1 of the first pulse signal P1 can be considered to represent a bit line charge sharing margin. Here, the bit line sharing margin means a timing margin from the instant of time when the word line enable signal WLE is enabled or activated to the instant of time when the bit line sensing enable signal BLSE is enabled/activated. During this timing margin, charges stored in cell capacitors of memory cells are distributed to the bit line.

FIG. 3B is a timing diagram of the input signals and the output signal of the second pulse generator 120 and 220 illustrated in FIGS. 1 and 2, respectively. The second pulse generator 120 and/or 220 receives the column select line enable signal CSLE and the first read pulse signal FRP and generates the second pulse signal P2. Referring to FIG. 3B, the pulse width PW2 of the second pulse signal P2 corresponds to the timing gap between activation of the column select line enable signal CSLE and activation of the first read pulse signal FRP. In other words, the pulse width PW2 represents a time period between a rising edge of the column select line enable signal CSLE and a rising edge of the first read pulse signal FRP. That is, the pulse width PW2 of the second pulse signal P2 can be considered to represent a column select line enable to first read pulse margin.

FIG. 3C is a timing diagram of the input signals and the output signal of the third pulse generator 130 and 230 illustrated in FIGS. 1 and 2, respectively. The third pulse generator 130 and/or 230 receives the word line disable signal WLD and the bit line equalizing signal BLEq and generates the third pulse signal P3. Referring to FIG. 3C, the pulse width PW3 of the third pulse signal P3 corresponds to the timing gap between activation of the word line disable signal WLD and activation of the bit line equalizing signal BLEq. In other words, the pulse width PW3 represents a time period between a rising edge of the word line disable signal WLD and a rising edge of the bit line equalizing signal BLEq. That is, the pulse width PW3 of the third pulse signal P3 can be considered to represent a word line disable to bit line equalizing margin.

Figure 4:
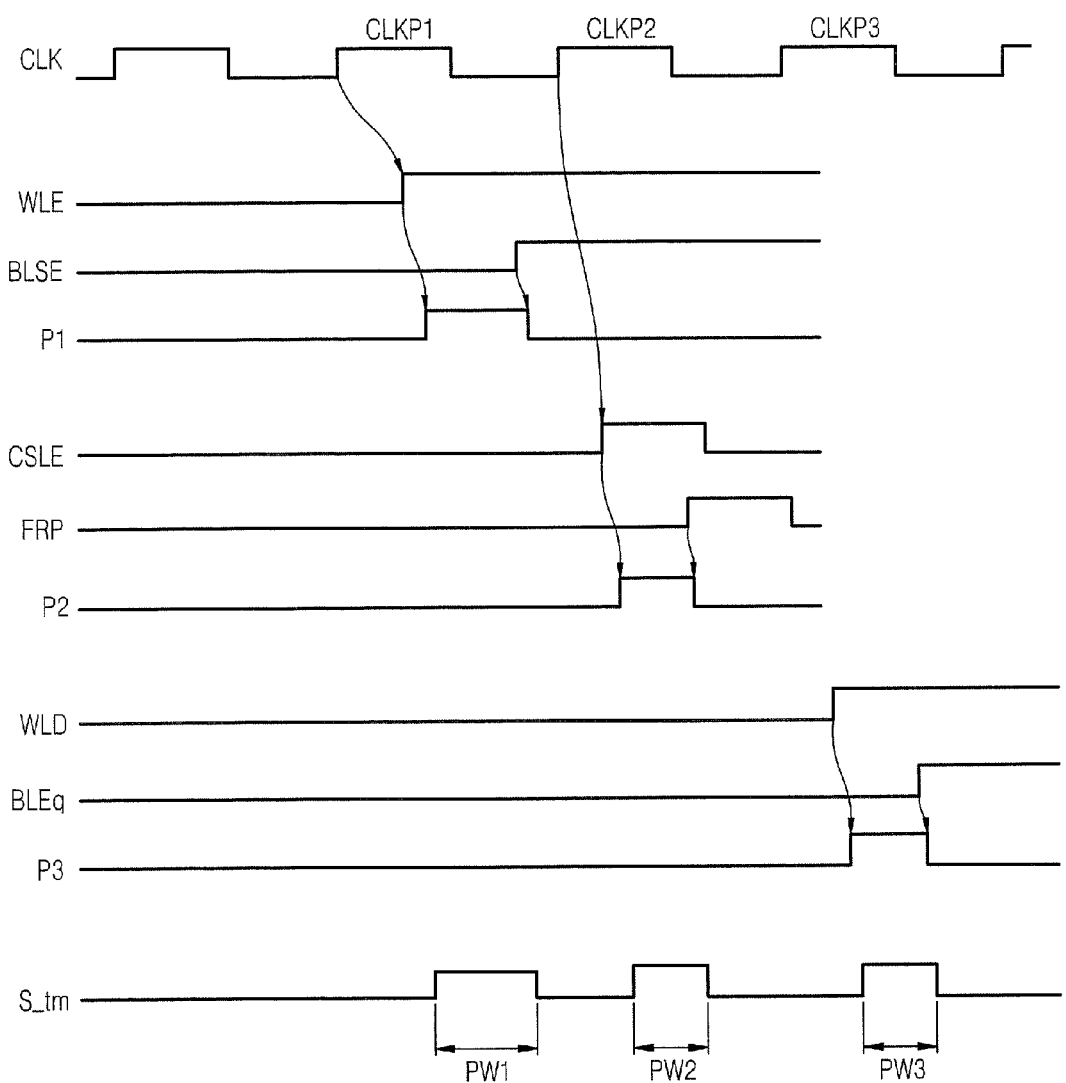
FIG. 4 is a timing diagram of input signals and output signals of the first pulse generator, the second pulse generator, the third pulse generator and a pulse summing unit according to some embodiments of the present invention.

FIG. 4 is a timing diagram of the input signals and the output signals of the first pulse generator 210, the second pulse generator 220, the third pulse generator 230 and the pulse summing unit 240 illustrated in FIG. 2, according to some embodiments of the present invention. That is, FIG. 4 illustrates the word line enable signal WLE, the bit line sensing enable signal BLSE, the first pulse signal P1, the column select line enable signal CSLE, the first read pulse signal FRP, the second pulse signal P2, the word line disable signal WLD, the bit line equalizing signal BLEq, the third pulse signal P3 and the timing measurement signal S_tm together with a reference clock signal CLK.

As illustrated in FIG. 4, the timing measurement signal S_tm includes information about the pulse width PW1 of the first pulse signal P1, the pulse width PW2 of the second pulse signal P2 and the pulse width PW3 of the third pulse signal P3. That is, the current timing parameter can be measured from the timing measurement signal S_tm output from the pulse summing unit 240. The current timing parameter represents information about the bit line charge sharing margin measured from the pulse width PW1 of the first pulse signal P1, information about the column select line enable to first read pulse margin measured from the pulse width PW2 of the second pulse signal P2, and information about the word line disable to bit line equalizing margin measured from the pulse width PW3 of the third pulse signal P3.

The timing measurement signal S_tm illustrated in FIG. 4 sequentially includes the information about the bit line charge sharing margin, the information about the column select line enable to first read pulse margin and the information about the word line disable to bit line equalizing margin in synchronization with the reference clock signal CLK of the integrated circuit memory device. That is, the information about the bit line charge sharing margin, the information about the column select line enable to first read pulse margin and the information about the word line disable to bit line equalizing margin can be sequentially loaded into the timing measurement signal S_tm in synchronization with sequential clock pulses CLKP1, CLKP2 and CLKP3, respectively.

Figure 5:
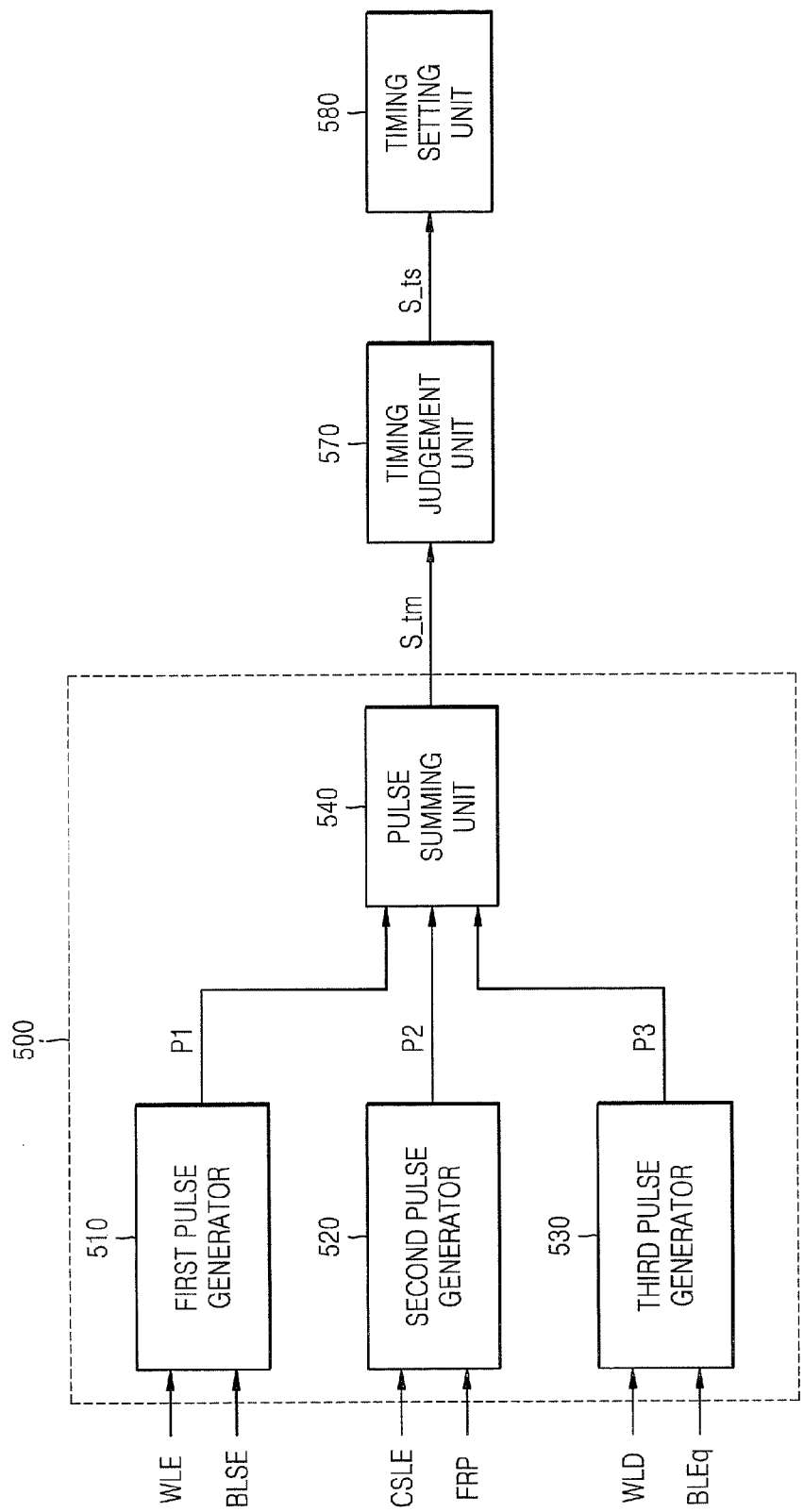
FIG. 5 is a block diagram of a timing regulating device according to some embodiments of the present invention.

FIG. 5 is a block diagram of a timing regulating device according to some embodiments of the present invention. FIG. 5 illustrates a timing measurement signal generator 500, a timing judgement unit 570 and a timing setting unit 580. The timing measurement signal generator 500 includes a first pulse generator 510, a second pulse generator 520, a third pulse generator 530 and a pulse summing unit 540.

As described above with reference to FIGS. 1 and 2, the timing measurement signal generator 500 sums up the first pulse signal P1 corresponding to the timing gap between the word line enable signal WLE and the bit line sensing enable signal BLSE, the second pulse signal P2 corresponding to the timing gap between the column select line enable signal CSLE and the first read pulse signal FRP, and the third pulse signal P3 corresponding to the timing gap between the word line disable signal WLD and the bit line equalizing signal BLEq in order to generate the timing measurement signal S_tm.

The timing judgement unit 570 judges whether the current timing parameter measured from the timing measurement signal S_tm are within an acceptable and/or other predetermined standard range, and outputs a timing set signal S_ts corresponding to the judgement result.

The timing setting unit 580 receives the timing set signal S_ts from the timing judgement unit 570 and sets timings of the word line enable signal WLE, the bit line sensing enable signal BLSE, the column select line enable signal CSLE, the first read pulse signal FRP, the word line disable signal WLD and the bit line equalizing signal BLEq in response to the received timing set signal S_ts. The timing setting unit 580 can set the timings of the aforementioned control signals, for example, using a fuse cutting method or other various timing setting methods.

Operations for regulating timing of control signals according to some embodiments of the present invention will be described as follows.

A timing regulating method for regulating timing gaps between control signals for controlling the operation of the integrated circuit memory device includes generating the first pulse signal P1 corresponding to the timing gap between the word line enable signal WLE and the bit line sensing enable signal BLSE, generating the second pulse signal P2 corresponding to the timing gap between the column select line enable signal CSLE and the first read pulse signal FRP output from an input/output sense amplifier, and generating the third pulse signal P3 corresponding to the timing gap between the word line disable signal WLD and the bit line equalizing signal BLEq. The timing control method further includes performing a logic OR operation on the first, second and third pulse signals P1, P2 and P3 in order to generate the timing measurement signal S_tm and an operation of judging whether the current timing parameters measured from the timing measurement signal S_tm are within an acceptable and/or other predetermined standard range. As described above, the current timing parameters represent information about the bit line charge sharing margin measured from the pulse width PW1 of the first pulse signal P1, information about the column select line enable to first read pulse margin measured from the pulse width PW2 of the second pulse signal P2, and/or information about the word line disable to bit line equalizing margin measured from the pulse width PW3 of the third pulse signal P3.

The timing control method further includes setting the timings of the word line enable signal WLE, the bit line sensing enable signal BLSE, the column select line enable signal CSLE, the first read pulse signal FRP, the word line disable signal WLD and the bit line equalizing signal BLEq in response to the timing judgement result.

The word line enable signal WLE, the bit line sensing enable signal BLSE, the word line disable signal WLD and the bit line equalizing signal BLEq are output from a row decoder of an integrated circuit memory device, the column select line enable signal CSLE is output from a column decoder of the integrated circuit memory device, and the first read pulse signal FRP is output from the input/output sense amplifier of the integrated circuit memory device.

As described above, timing gaps between control signals to be used in controlling the operation of an integrated circuit memory device can be easily measured using the timing measurement signal generator according to some embodiments of the present invention. Furthermore, the timing of the control signals may be controlled on the basis of the timing measurement signal generated by the timing measurement signal generator in order to reduce and/or prevent deterioration in the performance of the integrated circuit memory device, which may be caused by instability of the timing characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed:

1. A method of regulating timing of control signals in an integrated circuit memory device, the method comprising:
generating a timing measurement signal including a first pulse signal representing a first timing margin between a word line enable signal and a bit line sensing enable signal, a second pulse signal representing a second timing margin between a column select line enable signal and a first read pulse signal, and a third pulse signal representing a third timing margin between a word line disable signal and a bit line equalizing signal.

2. The method of claim 1, further comprising:
determining whether the first, second, and/or third timing margins are within predetermined ranges based on widths of the first, second, and/or third pulse signals of the timing measurement signal; and
altering the first, second, and/or third timing margins based on the determination.

3. The method of claim 2, wherein altering the first, second, and/or third timing margins comprises:
generating a timing set signal indicating that at least one of the first, second, and/or third timing margins are not within the predetermined range responsive to the determination; and
adjusting relative activation times of the word line enable signal and the bit line sensing enable signal, the column select line enable signal and the first read pulse signal, and/or the word line disable signal and the bit line equalizing signal based on the timing set signal.

4. The method of claim 1, wherein generating the timing measurement signal comprises:
generating the first pulse signal having a first pulse width representing a time period between a rising edge of the word line enable signal and a rising edge of the bit line sensing enable signal;
generating the second pulse signal having a second pulse width representing a time period between a rising edge of the column select line enable signal and a rising edge of the first read pulse signal;
generating the third pulse signal having a third pulse width representing a time period between a rising edge of the word line disable signal and a rising edge of the bit line equalizing signal; and
combining the first, second, and third pulse signals to generate the timing measurement signal.

5. The method of claim 4, wherein generating the first pulse signal comprises:
inverting the bit line sensing enable signal; and
performing a logic AND operation on the word line enable signal and the inverted bit line sensing enable signal to generate the first pulse signal.

6. The method of claim 4, wherein generating the second pulse signal comprises:
inverting the first read pulse signal; and
performing a logic AND operation on the column select line enable signal and the inverted first read pulse signal to generate the second pulse signal.

7. The method of claim 4, wherein generating the third pulse signal comprises:
inverting the bit line equalizing signal; and
performing a logic AND operation on the word line disable signal and the inverted bit line equalizing signal to generate the third pulse signal.

8. The method of claim 4, wherein the timing measurement signal are sequentially includes information about a bit line charge sharing margin measured from the first pulse width, information about a column select line enable to first read pulse margin measured from the second pulse width, and information about a word line disable to bit line equalizing margin measured from the third pulse width.

9. The method of claim 4, wherein combining the first, second, and third pulse signals comprises performing a logic OR operation on the first, second, and third pulse signals to generate the timing measurement signal.

10. A device for regulating timing of control signals in an integrated circuit memory device. comprising:
a timing measurement signal generator configured to generate a timing measurement signal including a first pulse signal representing a first timing margin between a word line enable signal and a bit line sensing enable signal, a second pulse signal representing a second timing margin between a column select line enable signal and a first read pulse signal, and a third pulse signal representing a third timing margin between a word line disable signal and a bit line equalizing signal.

11. The device of claim 10, further comprising:
a timing judgment unit configured to determine whether the first, second, and/or third timing margins are within predetermined ranges based on widths of the first, second, and/or third pulse signals of the timing measurement signal; and
a timing setting unit configured to alter the first, second, and/or third timing margins responsive to the determination of the timing judgment unit.

12. The device of claim 11, wherein the timing judgment unit is further configured to generate a timing set signal indicating that at least one of the first, second, and/or third timing margins are not within the predetermined range responsive to the determination and output the timing set signal to the timing setting unit, and wherein the timing setting unit is configured to adjust relative activation times of the word line enable signal and the bit line sensing enable signal, the column select line enable signal and the first read pulse signal, and/or the word line disable signal and the bit line equalizing signal based on the timing set signal.

13. The device of claim 10, wherein timing measurement signal generator comprises:
a first pulse generator configured to generate the first pulse signal having a first pulse width representing a time period between a rising edge of the word line enable signal and a rising edge of the bit line sensing enable signal;
a second pulse generator configured to generate the second pulse signal having a second pulse width representing a time period between a rising edge of the column select line enable signal and a rising edge of the first read pulse signal;
a third pulse generator configured to generate the third pulse signal having a third pulse width representing a time period between a rising edge of the word line disable signal and a rising edge of the bit line equalizing signal; and
a pulse summing unit configured to combine the first, second, and third pulse signals to generate the timing measurement signal.

14. The device of claim 13, wherein the first pulse generator comprises:
a first inverter configured to invert the bit line sensing enable signal; and
an AND gate configured to perform a logic AND operation on the word line enable signal and the inverted bit line sensing enable signal to generate the first pulse signal.

15. The device of claim 14, wherein the AND gate comprises:
a NAND gate configured to perform a logic NAND operation on the word line enable signal and the inverted bit line sensing enable signal; and
a second inverter configured to invert an output of the NAND gate to generate the first pulse signal.

16. The device of claim 13, wherein the first pulse generator receives the word line enable signal and the bit line sensing enable signal from a row decoder of the integrated circuit memory device.

17. The device of claim 13, wherein the second pulse generator comprises:
a first inverter configured to invert the first read pulse signal; and
an AND gate configured to perform a logic AND operation on the column select line enable signal and the inverted first read pulse signal to generate the second pulse signal.

18. The device of claim 17, wherein the second pulse generator further comprises:
a second inverter configured to invert the column select line enable signal; and
a third inverter configured to invert an output of the second inverter,
wherein the AND gate comprises a NAND gate configured to perform a logic NAND operation on an output of the third inverter and the inverted first read pulse signal, and a fourth inverter configured to invert an output of the NAND gate to generate the second pulse signal.

19. The device of claim 13, wherein the second pulse generator receives the column select line enable signal from a column decoder of the integrated circuit memory device, and receives the first read pulse signal from an input/output sense amplifier of the integrated circuit memory device.

20. The device of claim 13, wherein the third pulse generator comprises:
a first inverter configured to invert the bit line equalizing signal; and
an AND gate configured to perform a logic AND operation on the word line disable signal and the inverted bit line equalizing signal to generate the third pulse signal.

21. The device of claim 20, wherein the AND gate comprises:
a NAND gate configured to perform a logic NAND operation on the word line disable signal and the inverted bit line equalizing signal; and
a second inverter configured to invert an output of the NAND gate to generate the third pulse signal.

22. The device of claim 13, wherein the third pulse generator receives the word line disable signal and the bit line equalizing signal from a row decoder of the integrated circuit memory device.

23. The device of claim 13, wherein the timing measurement signal sequentially includes information about a bit line charge sharing margin measured from the first pulse width, information about a column select line enable to first read pulse margin measured from the second pulse width, and information about a word line disable to bit line equalizing margin measured from the third pulse width.

24. The device of claim 13, wherein pulse summing unit comprises:
an OR gale configured to perform a logic OR operation on the first, second, and third pulse signals to generate the timing measurement signal.

25. The device of claim 24, wherein the OR gate comprises:
a NOR gate configured to perform a logic NOR operation on the first, second, and third pulse signals; and
an inverter configured to invert an output of the NOR gate to generate the timing measurement signal.

26. The device of claim 10, wherein the timing measurement signal generator is configured to output the timing measurement signal to an output pad of the integrated circuit memory device via an output buffer.

* * * * *